US 6,563,564 B2

(12) United States Patent
de Mol et al.

(10) Patent No.: US 6,563,564 B2
(45) Date of Patent: May 13, 2003

(54) METHOD OF OPERATING AN OPTICAL IMAGING SYSTEM, LITHOGRAPHIC PROJECTION APPARATUS, DEVICE MANUFACTURING METHOD, AND DEVICE MANUFACTURED THEREBY

(75) Inventors: Christianus Gerardus Maria de Mol, Son en Breugel (NL); Thomas Josephus Maria Castenmiller, Eindhoven (NL); Marcel van Dijk, Eindhoven (NL); Franciscus Antonius Chrysogonus Marie Commissaris, Veldhoven (NL); Simon de Groot, Eindhoven (NL); Catharina Johanna Lucia Maria van den Enden, Eindhoven (NL)

(73) Assignee: ASM Lithography B.V., Veldhoven (NL)

( * ) Notice: Subject to any disclaimer, the term of this patent is extended or adjusted under 35 U.S.C. 154(b) by 0 days.

(21) Appl. No.: 09/878,182

(22) Filed: Jun. 12, 2001

(65) Prior Publication Data
US 2002/0036758 A1 Mar. 28, 2002

(30) Foreign Application Priority Data
Jun. 14, 2000 (EP) .............................................. 00305029

(51) Int. Cl.$^7$ ............................................... G03B 27/52
(52) U.S. Cl. ........................................... 355/52; 355/55
(58) Field of Search ............................... 355/52, 30, 55

(56) References Cited

U.S. PATENT DOCUMENTS

| | | | |
|---|---|---|---|
| 4,666,273 A | | 5/1987 | Shimizu et al. |
| 4,801,977 A | * | 1/1989 | Ishizaka et al. ................ 355/30 |
| 4,920,505 A | * | 4/1990 | Suzuki ......................... 355/55 |
| 5,424,803 A | | 6/1995 | Noguchi |
| 5,879,845 A | * | 3/1999 | Takahashi ..................... 430/30 |
| 6,088,082 A | * | 7/2000 | Yonekawa .................... 355/53 |

* cited by examiner

Primary Examiner—Russell Adams
Assistant Examiner—D. Ben Esplin
(74) Attorney, Agent, or Firm—Pillsbury Winthrop LLP (57) ABSTRACT

The present invention provides a method of operating a lithographic projection apparatus including calculating a change in aberration effect in the projection system, due to heating effects, as a function of time, based on at least one set of predetermined parameters; and adjusting the lithographic projection apparatus to compensate for the calculated change in aberration effect. The parameters are obtained by a calibration operation, which may comprise a coarse calibration followed by at least one fine calibration. The coarse calibration yields a first estimate of at least a subset of the parameters. The estimate can be used as an input for a subsequent fine calibration. The calibration may also comprise a single fine calibration.

22 Claims, 2 Drawing Sheets

METHOD OF OPERATING AN OPTICAL IMAGING SYSTEM, LITHOGRAPHIC PROJECTION APPARATUS, DEVICE MANUFACTURING METHOD, AND DEVICE MANUFACTURED THEREBY

BACKGROUND OF THE INVENTION

1. Field of the Invention

The present invention relates generally to lithographic projection apparatus and more specifically to lithographic projection apparatus incorporating aberration correction. 2. Background of the Related Art The term "patterning structure" as here employed should be broadly interpreted as referring to means that can be used to endow an incoming radiation beam with a patterned cross-section, corresponding to a pattern that is to be created in a target portion of the substrate; the term "light valve" can also be used in this context. Generally, the pattern will correspond to a particular functional layer in a device being created in the target portion, such as an integrated circuit or other device (see below). Examples of such patterning structure include:

A Mask.

The concept of a mask is well known in lithography, and it includes mask types such as binary, alternating phase-shift, and attenuated phase-shift, as well as various hybrid mask types. Placement of such a mask in the radiation beam causes selective transmission (in the case of a transmissive mask) or reflection (in the case of a reflective mask) of the radiation impinging on the mask, according to the pattern on the mask. In the case of a mask, the support structure will generally be a mask table, which ensures that the mask can be held at a desired position in the incoming radiation beam, and that it can be moved relative to the beam if so desired.

A Programmable Mirror Array.

An example of such a device is a matrix-addressable surface having a viscoelastic control layer and a reflective surface. The basic principle behind such an apparatus is that (for example) addressed areas of the reflective surface reflect incident light as diffracted light, whereas unaddressed areas reflect incident light as undiffracted light. Using an appropriate filter, the said undiffracted light can be filtered out of the reflected beam, leaving only the diffracted light behind; in this manner, the beam becomes patterned according to the addressing pattern of the matrix-adressable surface. The required matrix addressing can be performed using suitable electronic means. More information on such mirror arrays can be gleaned, for example, from U.S. Pat. No. 5,296,891 and U.S. Pat. No. 5,523,193, which are incorporated herein by reference. In the case of a programmable mirror array, the said support structure may be embodied as a frame or table, for example, which may be fixed or movable as required.

A Programmable LCD Array.

An example of such a construction is given in U.S. Pat. No. 5,229,872, which is incorporated herein by reference. As above, the support structure in this case may be embodied as a frame or table, for example, which may be fixed or movable as required.

For purposes of simplicity, the rest of this text may, at certain locations, specifically direct itself to examples involving a mask and mask table; however, the general principles discussed in such instances should be seen in the broader context of the patterning structure as hereabove set forth.

Lithographic projection apparatus can be used, for example, in the manufacture of integrated circuits (ICs). In such a case, the patterning structure may generate a circuit pattern corresponding to an individual layer of the IC, and this pattern can be imaged onto a target portion (e.g. comprising one or more dies) on a substrate (silicon wafer) that has been coated with a layer of radiation-sensitive material (resist). In general, a single wafer will contain a whole network of adjacent target portions that are successively irradiated via the projection system, one at a time. In current apparatus, employing patterning by a mask on a mask table, a distinction can be made between two different types of machine. In one type of lithographic projection apparatus, each target portion is irradiated by exposing the entire mask pattern onto the target portion at once; such an apparatus is commonly referred to as a wafer stepper. In an alternative apparatus—commonly referred to as a step-and-scan apparatus—each target portion is irradiated by progressively scanning the mask pattern under the projection beam in a given reference direction (the "scanning" direction) while synchronously scanning the substrate table parallel or anti-parallel to this direction; since, in general, the projection system will have a magnification factor M (generally <1), the speed V at which the substrate table is scanned will be a factor M times that at which the mask table is scanned. More information with regard to lithographic devices as here described can be gleaned, for example, from U.S. Pat. No. 6,046,792, incorporated herein by reference.

In a manufacturing process using a lithographic projection apparatus, a pattern (e.g. in a mask) is imaged onto a substrate that is at least partially covered by a layer of radiation-sensitive material (resist). Prior to this imaging step, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g. an IC. Such a patterned layer may then undergo various processes such as etching, ion-implantation (doping), metallization, oxidation, chemo-mechanical polishing, etc., all intended to finish off an individual layer.

If several layers are required, then the whole procedure, or a variant thereof, will have to be repeated for each new layer. An important aspect of the performance of a lithographic projection apparatus is the so-called alignment accuracy. In the manufacture of an IC, which is often built up of several (tens of) patterned layers, it is extremely important to ensure that the overlay juxtaposition) of the various stacked layers is as accurate as possible. For this purpose, a small reference mark is provided at one or more positions on the wafer, thus defining the origin of a co-ordinate system on the wafer; using optical and electronic means (referred to hereinafter as "alignment system"), this mark can then be re-located each time a new layer has to be juxtaposed on an existing layer, and can be used as an alignment reference.

Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4, incorporated herein by reference.

For the sake of simplicity, the projection system may hereinafter be referred to as the "lens"; however, this term should be broadly interpreted as encompassing various types of projection system, including refractive optics, reflective optics, and catadioptric systems, for example. The radiation system may also include components operating according to any of these design types for directing, shaping or controlling the projection beam of radiation, and such components may also be referred to below, collectively or singularly, as a "lens". Further, the lithographic apparatus may be of a type having two or more substrate tables (and/or two or more mask tables). In such "multiple stage" devices the additional tables may be used in parallel, or preparatory steps may be carried out on one or more tables while one or more other tables are being used for exposures. Twin stage lithographic apparatus are described, for example, in U.S. Pat. No. 5,969,441 and WO 98/40791, incorporated herein by reference.

The phenomenon of lens heating can occur in the projection system of a lithographic projection apparatus. The projection lens becomes slightly heated by the projection beam radiation during exposures. As a result of this heating, refractive index changes occur, and a certain expansion of lens elements occurs, causing subtle changes in the geometric form of those elements, with an attendant change in their optical properties. This can result in the occurrence of new lens aberrations, or a change in existing aberrations. Because the occurrence or worsening of these aberrations depends on such matters as the particular lens geometry, lens material, projection wavelength, light source power, target portion size, and so on, the phenomenon is intrinsically unpredictable.

Lens heating has always occurred to some extent in lithographic projection apparatus. However, with the trend to integrating an ever-increasing number of electronic components in an IC, and to increase the manufacturing throughput, shorter wavelength radiation, such as deep ultraviolet (DUV), 193 nm and 157 nm radiation has been used, as well as high-power radiation sources, such as 3–6 kW Mercury-arc lamps and excimer lasers with a power of 10 to 20 W, which together with the reduction in feature size have made lens heating a more serious problem. The problem is generally worse in scanners than in steppers because, in a stepper, substantially the whole (circular) cross-section of each lens element is irradiated, whereas, in a scanner, generally only a slit-shaped portion of the lens elements is irradiated; consequently, the effect in a scanner is far more differential than in a stepper, thereby resulting in the occurrence of new lens aberrations.

It is a further problem that the above problems cannot be satisfactorily prevented by measures such as the use of lens cooling jackets.

It is an object of the present invention to provide an improved imaging method and apparatus in which said problems are alleviated.

Accordingly, the present invention provides a method of operating a lithographic projection apparatus as specified in the opening paragraph, the method including calculating a change in aberration effect in said projection system, due to heating effects, as a function of time, based on at least one set of predetermined parameters, and adjusting the lithographic projection apparatus to compensate for the calculated change in aberration effect.

Preferably said parameters are obtained by a calibration step. The calibration step may comprise a coarse calibration followed by at least one fine calibration, where the coarse calibration yields a first estimate of at least a subset of the parameters. Said first estimate can be used as an input for the subsequent fine calibration. However, first estimates of parameters may, for example, be available from design data or empirical evidence. In this latter case the calibration may comprise a single (fine) calibration step.

Preferably a (fine) calibration is successively performed at a plurality of different illumination settings and/or with a plurality of different patterns as provided by patterning structure and/or with a plurality of different substrates provided on said substrate table, wherein a set of parameters is obtained for each calibration, and the sets of parameters from the calibrations are stored in a database.

Said plurality of different illumination settings may comprise different numerical aperture settings and/or sigma settings (defined below), illumination modes or telecentricity modes; furthermore, one may use various types and sizes of test structures on one or more test masks to create different diffraction effects in the projection system. All such variation should be interpreted as falling within the meaning of the phrase "different illumination settings" of the radiation system, as used in this text. The term "sigma ($\sigma$) setting" refers to the outer and/or inner radial extent (commonly referred to as $\sigma$-outer and $\sigma$-inner, respectively) of the intensity distribution of the projection beam in a pupil plane of the radiation system, normalized with respect to the maximum radius of the pupil. Thus, a sigma value of 1 represents illumination with a radius at the pupil equal to the maximum radius of the pupil. The term "illumination mode" denotes the spatial distribution of the radiation at the pupil, which may, for example, be disc-shaped, annular (which would be characterized by inner and outer sigma settings), quadrupolar, dipolar, or soft-multipolar (including some radiation flux in between and/or around the poles), for example. More information on illumination modes can be gleaned, for example, from European Patent Application No. 00311007.9, incorporated herein by reference. The term "telecentricity modes" encompasses configuring the radiation system and/or projection system telecentrically and/or with varying degrees of non-telecentricity, for example by the use of prisms on top of a reticle to tilt the illumination profile. These different illumination settings can be selected conveniently in a lithographic projection apparatus.

Preferably some of said parameters are common between sets, which enables fewer calibration steps to be performed and reduces the database size.

Advantageously, for operating said lithographic projection apparatus under conditions for which a set of parameters has not been predetermined, said calculating step comprises interpolating or extrapolating at least one of said parameters based on parameters obtained for the projection apparatus under different conditions.

Preferably, said aberration effect comprises at least one of focus drift, field curvature, magnification drift, third-order distortion, spherical aberration, comatic aberration, on-axis astigmatism, asymmetric magnification and combinations thereof.

Preferably, said adjusting step comprises adjusting at least one of: the position of the support structure along the optical axis of the projection system, the rotational orientation of the support structure, the position of the substrate table along said optical axis, the rotational orientation of the substrate table, the position along said optical axis of one or more moveable lens elements comprised in said projection system, the degree of decentering with respect to said optical axis of one or more moveable lens elements comprised in said projection system, the central wavelength of the projection beam, and saddle-like deformation of one or more lens elements comprised in said projection system using edge actuators.

The present invention also provides a lithographic projection apparatus for imaging a pattern as provided by patterning structure onto a substrate provided with a radiation-sensitive layer, the apparatus including a radiation system for providing a projection beam of radiation, a support structure for supporting patterning structure, the patterning structure serving to pattern the projection beam according to a desired pattern, a substrate table for holding a substrate, a projection system for projecting the patterned beam onto a target portion of the substrate, and illumination setting means for providing a plurality of different illumination settings of said radiation system, a memory to store at least one set of predetermined parameters, a processor to calculate a change in aberration effect in said projection system, due to heating effects, as a function of time, based on a set of said parameters stored in said memory means and a controller to adjust at least one component of said apparatus to compensate for the calculated change in aberration effect.

According to a further aspect of the invention there is provided a device manufacturing method including providing a substrate that is at least partially covered by a layer of radiation-sensitive material, providing a projection beam of radiation using a radiation system, using patterning structure to endow the projection beam with a pattern in its cross-section, projecting the patterned beam of radiation onto a target portion of the layer of radiation-sensitive material, calculating, during series of repeated exposures of corresponding series of target portions, a change in aberration effect in said projection system as a function of time, based on at least one set of predetermined parameters, and adjusting the lithographic projection apparatus to compensate for the calculated change in aberration effect.

Although specific reference may be made in this text to the use of the apparatus according to the invention in the manufacture of ICs, it should be explicitly understood that such an apparatus has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle", "wafer" or "die" in this text should be considered as being replaced by the more general terms "mask", "substrate" and "target portion", respectively.

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range 5–20 nm). The term "heating" as used throughout this text, should, in principle, be interpreted as encompassing cooling also.

BRIEF DESCRIPTION OF THE DRAWINGS

Embodiments of the invention will now be described, by way of example only, with reference to the accompanying schematic drawings in which.

In the Figures, corresponding reference symbols indicate corresponding parts.

DETAILED DESCRIPTION

Embodiment 1

Figure 1:
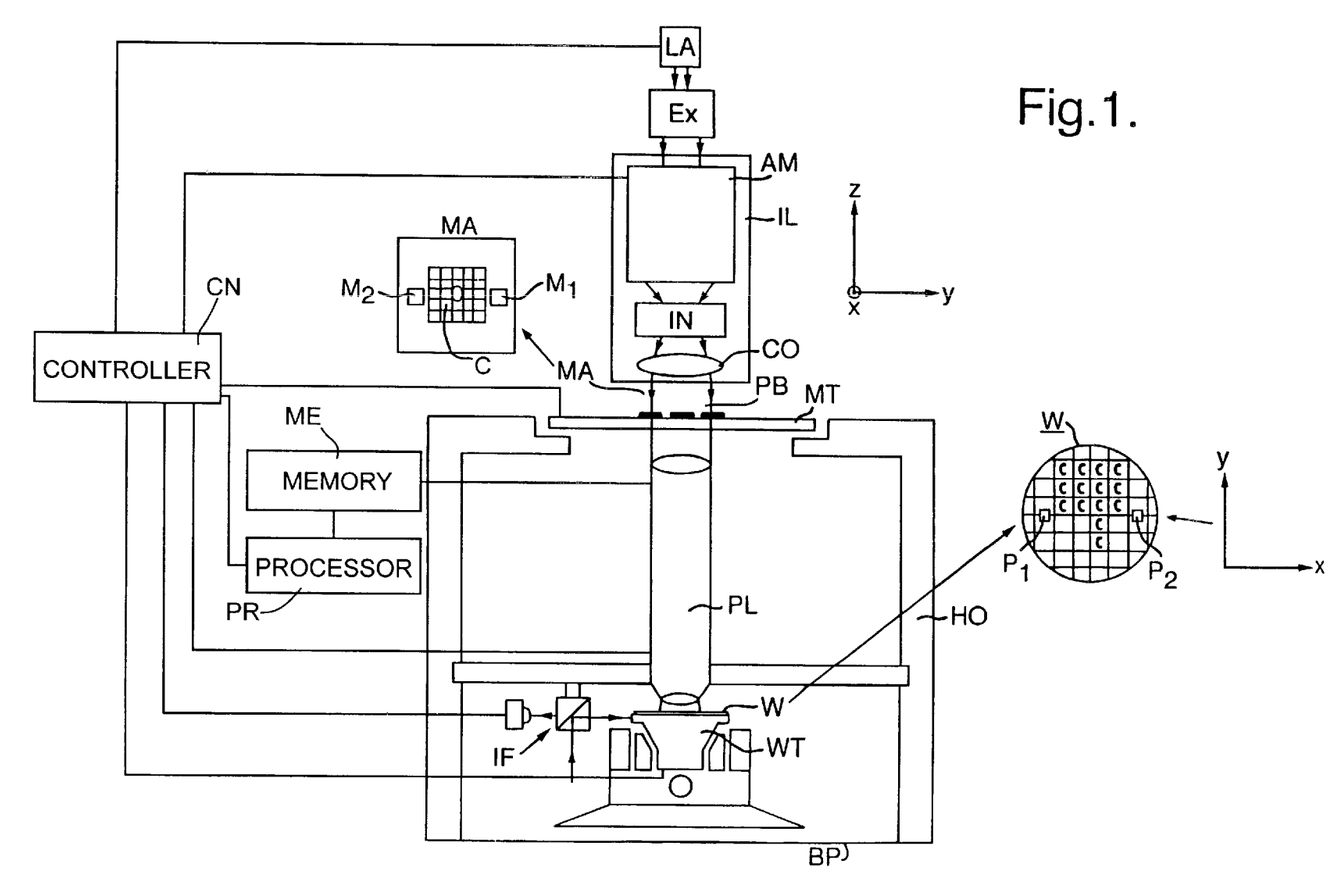
FIG. 1 depicts a lithographic projection apparatus according to an embodiment of the invention.

FIG. 1 schematically depicts a lithographic projection apparatus according to a particular embodiment of the invention. The apparatus comprises:

a radiation system Ex, IL, for supplying a projection beam PB of radiation (e.g. UV, DUV or EUV radiation). In this particular case, the radiation system also comprises a radiation source LA;

a first object table (mask table) MT provided with a mask holder for holding a mask MA (e.g. a reticle), and connected to first positioning means for accurately positioning the mask with respect to item PL;

a second object table (substrate table) WT provided with a substrate holder for holding a substrate W (e.g. a resist-coated silicon wafer), and connected to second positioning means for accurately positioning the substrate with respect to item PL;

a projection system ("lens") PL (e.g. a refractive lens system, a quartz and/or $CaF_2$ lens system or a catadioptric system comprising lens elements made from such materials, or a mirror system) for imaging an irradiated portion of the mask MA onto a target portion C (e.g. comprising one or more dies) of the substrate W.

a memory ME to store at least one set of predetermined parameters, e.g., time constraints and scaling factors.

a processor PR to calculate a change in at least one selected aberration effect from a plurality of aberration effects in the projection system PL, due to heating effects, as a function of time, based on a set of the parameters stored in the memory ME.

a controller CN to adjust at least one component of the apparatus, e.g., the radiation source LA, the first object table (mask table) MT, the second object table (substrate table) WT, the projection system ("lens") PL, interferometric measuring means IF, and the processor PR, to compensate for the calculated change in aberration effect.

As here depicted, the apparatus is of a transmissive type (i.e. has a transmissive mask). However, in general, it may also be of a reflective type, for example (with a reflective mask). Alternatively, the apparatus may employ another kind of patterning structure, such as a programmable mirror array of a type as referred to above.

The source LA (e.g. a Mercury arc lamp, a DUV excimer laser, a laser-produced plasma source, a discharge source, or an undulator or wiggler provided around the path of an electron beam in a storage ring or synchrotron) produces a beam of radiation. This beam is fed into an illumination system (illuminator) IL, either directly or after having traversed conditioning means, such as a beam expander Ex, for example. The illuminator IL may comprise adjusting means AM for setting σ-outer and σ-inner, respectively. In addition, it will generally comprise various other components, such as an integrator IN and a condenser CO. In this way, the beam PB impinging on the mask MA has a desired uniformity and intensity distribution in its cross-section.

It should be noted with regard to FIG. 1 that the source LA may be within the housing of the lithographic projection apparatus (as is often the case when the source LA is a mercury lamp, for example), but that it may also be remote from the lithographic projection apparatus, the radiation beam which it produces being led into the apparatus (e.g. with the aid of suitable directing mirrors); this latter scenario is often the case when the source LA is an excimer laser. The current invention and claims encompass both of these scenarios.

The beam PB subsequently intercepts the mask MA, which is held on a mask table MT. Having traversed the mask MA, the beam PB passes through the lens PL, which focuses the beam PB onto a target portion C of the substrate W. With the aid of the second positioning means (and interferometric measuring means IF), the substrate table WT can be moved accurately, e.g. so as to position different target portions C in the path of the beam PB. Similarly, the first positioning means can be used to accurately position the mask MA with respect to the path of the beam PB, e.g. after mechanical retrieval of the mask MA from a mask library, or during a scan. In general, movement of the object tables MT, WT will be realized with the aid of a long-stroke module (coarse positioning) and a short-stroke module (fine positioning), which are not explicitly depicted in FIG. 1. However, in the case of a wafer stepper (as opposed to a step-and-scan apparatus) the mask table MT may just be connected to a short stroke actuator, or may be fixed.

The depicted apparatus can be used in two different modes:

In step mode, the mask table MT is kept essentially stationary, and an entire mask image is projected at once (i.e. a single "flash") onto a target portion C. The substrate table WT is then shifted in the x and/or y directions so that a different target portion C can be irradiated by the beam PB;

In scan mode, essentially the same scenario applies, except that a given target portion C is not exposed in a single "flash". Instead, the mask table MT is movable in a given direction (the so-called "scan direction", e.g. the y direction) with a speed v, so that the projection beam PB is caused to scan over a mask image; concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

As explained previously, when the projection beam radiation PB passes though the projection lens system PL, part of it is absorbed in lens elements and coating materials. This partial absorption causes global and local temperature and refractive index changes in the lens elements. This results in changes in the optical performance of the lens, which can be characterized as lens aberration. The overall aberration can be decomposed into a number of different types of aberration, such as spherical aberration, astigmatism and so on. The overall aberration is the sum of these different aberrations, each with a particular magnitude given by a coefficient. Aberration results in a deformation in the wave front and different types of aberration represent different functions by which the wave front is deformed. These functions may take the form of the product of a polynomial in the radial position r and an angular function in sine or cosine of $m\theta$, where r and $\theta$ are polar coordinates and m is an integer. One such functional expansion is the Zernike expansion in which each Zernike polynomial represents a different type of aberration and the contribution of each aberration is given by a Zernike coefficient.

Particular types of aberration, such as focus drift, field curvature and aberrations with even values of m (or m=0) in the angular functions dependent on $m\theta$, result in displacement of the projected image in the vertical (z) direction. Other aberrations, such as magnification drift, third-order distortion, asymmetric magnification, coma, and aberrations with an odd value of m, result in a lateral shift in the image position in the horizontal plane (the x,y-plane).

The best-focus (BF) position, i.e. z-position of the image, can be measured using the actual lithographic projection apparatus. The best-focus position is the z-position with maximum contrast, e.g. defined by the maximum of a sixth-order polynomial fit to the contrast-versus-position curve as the position is moved from defocus, through focus and on to defocus. The best-focus can be determined experimentally using known techniques, such as the technique known as "FOCAL" (described below); alternatively, one may directly measure the aerial image, e.g. using a Transmission Image Sensor (TIS) (described below), or an overlay microscope or commercial focus monitor.

FOCAL is an acronym for FOcus CAlibration by using ALignment. It is a best-focus measurement technique for completely determining information about the focal plane using the alignment system of the lithographic apparatus. A special, asymmetrically segmented alignment mark is imaged through focus on to a resist coated wafer. The position of this imaged mark (latent or developed) can be measured by the said alignment system. Due to the asymmetric segmentation, the position measured by the alignment system will depend on the defocus used during exposure, thus allowing determination of the best-focus position. By distributing these marks over the whole image field and using different orientation for the segmentation, the complete focal plane for several structure orientations can be measured. This technique is described in more detail in U.S. Pat. No. 5,674,650 which is incorporated herein by reference.

One or more transmission image sensor(s) (TIS) can be used to determine the lateral position and best focus position (i.e. horizontal and vertical position) of the projected image from the mask under the projection lens. A transmission image sensor (TIS) is inset into a physical reference surface associated with the substrate table (WT). In a particular embodiment, two sensors are mounted on fiducial plates mounted to the substrate-bearing surface of the substrate table (WT), at diagonally opposite positions outside the area covered by the wafer W. Each fiducial plate is made of a highly stable material with a very low coefficient of thermal expansion, e.g. Invar, and has a flat reflective upper surface which may carry markers used with another fiducial in alignment processes. The TIS is used to determine directly the vertical (and horizontal) position of the aerial image of the projection lens. It comprises apertures in the respective surface close behind which is placed a photodetector sensitive to the radiation used for the exposure process. To determine the position of the focal plane, the projection lens projects into space an image of a pattern provided on the mask MA (or on a mask table fiducial plate) and having contrasting light and dark regions. The substrate stage is then scanned horizontally (in one or preferably two directions, e.g. the x and y directions) and vertically so that the aperture of the TIS passes through the space where the aerial image is expected to be. As the TIS aperture passes through the light and dark portions of the image of the TIS pattern, the output of the photodetector will fluctuate (a Moiré effect). The vertical level at which the rate of change of amplitude of the photodetector output is highest indicates the level at which the image of TIS pattern has the greatest contrast and hence indicates the plane of optimum focus. The x,y-positions of the TIS aperture at which the rate of change of amplitude of the photodetector output during said horizontal scan is highest, are indicative of the aerial image's lateral position. An example of a TIS of this type is described in greater detail in U.S. Pat. No. 4,540,277, incorporated herein by reference. Advantages of TIS include robustness and speed because it is a direct measurement technique not involving exposure of a resist.

A number of modifications to TIS, which are described below, have been devised which can be used with the present invention, or independently thereof, and they may also be used separately or in any combination:

TIS can be used with a special calibration step to measure the actual critical density (CD) distribution of a reticle being imaged in practice. The CD-distribution can be measured on the machine, rather than separately, and the imaging is measured directly and independently of the resist processing.

TIS marks conventionally comprise grating-like features and coarse alignment (or capture alignment) of these can be time-consuming. Advantageously, a blank aperture is incorporated in TIS marks. This aperture takes the form of a small featureless "hole" in the mark. The presence of such a blank aperture allows efficient coarse alignment in the x, y and z directions. Preferably the blank aperture takes the form of a small rectangular area in the middle of the "cross" formed by perpendicularly arranged grating-like structures.

TIS marks conventionally comprise grating-like structures, and each grating comprises an array of mutually identical lines. In a situation in which both isolated and dense lines are to be imaged, such TIS marks cannot give optimal results for both types of lines. Advantageously, different lines may be used within the TIS gratings, for example, some lines may be single lines, whereas others are closely-nested groups of sub-lines; the former then mimic isolated lines, and the latter mimic dense lines. Overall the TIS performance is improved.

TIS can be used to measure and characterize astigmatism and other forms of aberration, which may entail measurement in four different in-plane directions. Conventionally, this has necessitated large stage movements, of the order of mm, because only one grating orientation is present over each photodiode sensor. This results in relatively large inaccuracy in the focus measurements needed for astigmatism determination. Advantageously, a dedicated TIS mark for astigmatism measurements can be provided, and this mark can be small because, preferably, the different measurements should be performed in as compact an area as possible. In one preferred form, the mark has the form of a square divided into four square quadrants; two diagonally opposite quadrants have horizontal and vertical grating lines and the remaining two quadrants have diagonal lines oriented at ±45°, respectively. This mark need only be about as large as the central "square" in a conventional TIS mark such that the whole mark will fit above a single photodiode. Consequently, it is possible to detect multiple orientations using just one photodiode, which is cheaper and causes less heat dissipation in the machine. By detecting more than two orientations it is possible to distinguish between, for instance, coma and 3-wave (third-order) aberration.

Conventionally, in the TIS technique, an aerial image is scanned using a slit-like aperture. The slit-width must be tailored to the wavelength of the projection beam, and to the line-size of the marks. Advantageously, the slit can be replaced by a knife-edge. By scanning the knife-edge through the aerial image and differentiating the obtained measurement signal, one obtains the same information as with a slit, but with greater resolution. Thus the dependency on slit-width is removed and the resolution is improved. If desired, it is possible to employ more than one knife edge, for example two knife edges arranged in an L-configuration for conveniently scanning in two perpendicular directions.

Previously, a TIS mark comprised a plurality of gratings arranged in a pattern. Advantageously, a single slit can be used instead of a grating array. The use of a single slit allows much greater resolution. In addition, there is greater flexibility; the fiducial plate mark becomes independent of the reticle mark. Box-in-box structures present in the scribe-lanes of reticles can be scanned. If desired, two slits can be employed, arranged in an L-configuration; this facilitates scanning in two perpendicular directions.

In cases where the parameter of the image (the best-focus position in this case) is obtained using the FOCAL technique at a plurality of different illumination settings, this will also be referred to by the acronym FAMIS, which stands for FOCAL At Multiple Illumination Settings.

The lateral shift in image position can be measured in an actual lithographic projection apparatus using a distortion-measuring technique hereinafter referred to as "DISTO" (described below); alternatively, one may directly measure the aerial image, e.g. using a Transmission Image Sensor (TIS) (described above) or other technique mentioned in connection with the first embodiment.

DISTO is a technique for finding the lateral positional errors of the image plane (x,y plane). A standard alignment mark, consisting of horizontal and vertical equal lines/spaces (e.g. line width 8 $\mu$m for the imaged mark), is imaged on to a resist-coated wafer. The position of this imaged mark (latent or developed) can be measured by the alignment system of the lithographic apparatus. The deviation with respect to the expected position is the distortion. By distributing these marks over the whole image field, the complete image field distortion can be measured.

Where the DISTO technique is used at multiple illumination settings, this is referred to as "DAMIS", an acronym for DISTO At Multiple Illumination Settings. For further information on DAMIS and FAMIS see U.S. Ser. No. 09/788,478, Filed Feb. 21, 2001, incorporated herein by reference.

Other techniques can also be used to analyze the image, for example using a reflection image sensor (RIS) or using an aberration ring test (ART) and its variants, such as ART at multiple illumination settings, known as ARTEMIS; see for instance EP 1 049 960 A1, incorporated herein by reference.

From these measurements of the image position, it is possible to obtain the coefficients of the different forms of aberration. This is explained more fully in, for example, European Patent Application No. 01301571.4, incorporated herein by reference.

The lens aberration will, in general, also be a function of the illumination setting of the radiation system, e.g. numerical aperture, sigma setting, and illumination modes such as disc-like, annular or multipolar. The lens-heating-induced aberration effect is also, in general, dependent on parameters such as the illumination setting, reticle transmission, reticle structure, field size and shape, light intensity, wafer reflectivity and wafer layout, so it is difficult to calculate from first principles and is generally pathological. The lens-heating induced aberration effect also varies dynamically with time, so in order to correct for this lens-heating induced aberration effect, the present embodiment employs a model of the effects of lens heating based on previous measurements, optionally calibrates and fine-tunes the model using intermittent measurements and makes adjustment to the lithographic projection apparatus to keep all aberrations and hence imaging parameters within their respective tolerances.

Considering the aberration effect known as focus drift caused by lens heating, the model employed in this first embodiment is as follows:

$$F(t) = A_1(1 - e^{-t/\tau_1}) + A_2(1 - e^{-t/\tau_2}) \quad (1)$$

Thus the drift F as a function of time t, i.e. the change in best-focus position in the z-direction relative to its position at t=0, is described by two exponential functions and this has been found to be a good model, particularly for scanner systems. Each of the exponential functions has a time-constant, $\tau_1$ and $\tau_2$ respectively, and each has an amplitude, $A_1$ and $A_2$ respectively. The values of the amplitudes and time constants depend on at least a subset of the parameters of illumination setting, reticle transmission, reticle structure, field size and shape, radiation intensity, wafer reflectivity and wafer layout. The model of this embodiment further assumes a linear dependency of the amplitudes on some of these parameters, and particularly those proportional to the power incident on the lens, such as the light intensity, field size, reticle transmission factor and wafer reflectivity, such that the amplitudes may be written as:

$$A_1 = \mu_1 \cdot T_r \cdot S \cdot I \cdot W_{refl}$$

$$A_2 = \mu_2 \cdot T_r \cdot S \cdot I \cdot W_{refl} \quad (2)$$

where I is the exposure light intensity (W/m$^2$), S is the field size or reticle masking area at wafer level (m$^2$), $T_r$ is the reticle transmission factor (a pure fraction or percentage), $W_{refl}$ is the wafer reflectivity (a pure fraction or percentage), and $\mu_{1,2}$ are so-called scaling factors, which are phenomenological and depend on all the other parameters that affect lens heating but that are not specifically included.

Figure 2:
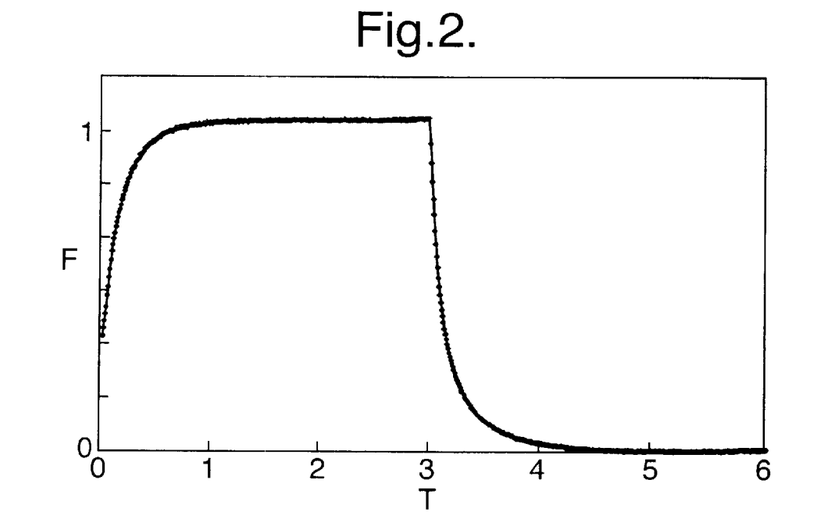
FIG. 2 is a graph illustrating focus drift by showing the heating and cooling trajectories of the focus position of a lithographic projection apparatus.

The scaling factors represent the lens heating sensitivity at the particular illumination setting, reticle structure and field shape used for the exposure. According to this model, the lens focus position drifts according to a trajectory given by Equation (1); lens cooling can be modelled with the same parameters. Starting from "cold", the focus drift tends towards a saturation value at which an equilibrium is reached in which the rate at which energy received by the lens equals the rate at which the lens dissipates heat. Similarly, starting from warm, the focus position drifts toward its default value under conditions of no lens heating. A typical plot showing the lens heating and cooling focus drift trajectory is given in FIG. 2. Along the horizontal and vertical axes the time T and the drift F are plotted, respectively, in arbitrary units.

To obtain the four parameters, that is two time constants and two scaling factors, for a particular machine at a particular illumination setting, the following method of this first embodiment is preferred. A heating phase is first performed during which the lens is heated (by the exposure radiation) continuously for two hours with fully opened reticle masking blades (defined below) and no reticle present. The reticle masking blades are a shuttering system interposed at some location in the radiation path to define the illumination field, i.e. the size and shape of the beam incident on the reticle. The heating is done with a wafer coated with photoresist on the wafer table to take into account the effect of wafer reflectivity. A coarse calibration is then done whereby the best focus position is measured, using for example a limited number of TIS markers, while the lens cools down and the focus drift returns to its default position. The focus position can be measured using so-called actinic alignment, in which the exposure radiation is directly used, but only briefly to avoid further heating effects. Alternatively, or in addition, an attenuator can be used to reduce the intensity of the exposure radiation during the measurements, to further prevent lens heating during the measurements. Alternatively, a so-called red alignment technique can be used in which a different radiation, such as red light from a helium neon laser is used in a through-the-lens (TTL) technique to determine the best focus position, but without lens heating. Appropriate corrections can be made, if necessary, to account for the fact that the alignment radiation may have a different wavelength from the exposure radiation.

In a particular embodiment, cooling measurements are done every 30 seconds on any of five TIS markers on the x-axis and four off-axis markers (two with positive y-coordinate and two with negative y-coordinate).

From the measurements the scaling factors and time constants can be estimated from the model of Equation 1. Since the model is not linear in these parameters, they are computed iteratively using, for example, the conjugate gradient method, an algorithm for finding the minima of a multidimensional function. Values for the scaling factors $\mu_1$ and $\mu_2$ and time constants $\tau_1$ and $\tau_2$ are computed by minimizing the following object function J, using a least-squares criterion, with respect to these parameters:

$$J = \sum_{i=1}^{n} (F_{obs}(t_i) - F(t_i))^2 \quad (3)$$

where $F_{obs}(t)$ is the focus position measured (by an image sensor), F(t) is the corresponding value from the model given in Equation (1), n is the number of measurements during the cool down period, and $t_i$, i=1, . . . , n, are the corresponding time coordinates of these measurements. When the minimum value of the object function has been found, the residue R, which indicates how well the fit is with the found parameters, is defined as:

$$R = \sqrt{\frac{J}{n}} \quad (4)$$

The fit is considered satisfactory if the residue is less than 30 nm, which indicates that the (image sensor) measurements are reliably within a 99.7% confidence interval.

On a particular machine, the two time constants have been found usually to have a value between 180 and 530 seconds, and 750 and 1220 seconds, respectively. These time constants are quite well found by this coarse calibration, but a fine calibration is preferably performed to obtain better values for the scaling factors. One reason why the scaling factors are not so accurately found by the coarse calibration is that during the heating phase, the wafer has been continuously exposed for two hours, which causes the reflectivity of the photoresist to increase, which results in the scaling factor being overestimated. Estimates for the time constants resulting from coarse calibration can subsequently be used as a basis for fine calibration, even at different illumination settings. The step of fine calibration may be referred to hereafter as "fine tuning" as well. Thus one coarse calibration measurement could be done at one illumination setting, followed by several fine tuning tests at different illumination settings, to obtain the different values of the scaling factors for the different illumination settings. The time constants obtained from the coarse calibration are, in this embodiment, used at all other settings, assuming that by measuring the focus every 30 seconds the dynamic behaviour is modelled sufficiently well so that errors in the time constants have only a small impact on the focus drift. The fact that the dynamic behaviour is substantially an intrinsic lens characteristic, independent of the amount of energy received by the lens, supports said assumption.

The fine tuning measurements are made, according to this embodiment, using the FOCAL technique described above using exposures on wafers. Alternatively, TIS can be used to measure lens-heating-induced effects. Both methods use alternate dummy heating exposures and measurements (measurement exposures in the case of FOCAL and direct measurements of the aerial image in the case of TIS). The dummy exposures are done to (successively) heat up the lens a little bit further, and the TIS scans/FOCAL exposures are done to determine an aberration effect (such as, for example focus drift) at that particular stage in the lens heating trajectory. This alternately exposing and measuring is done for a specified period of time, usually in the range of from 30 to 120 minutes.

In this way, a lens heating database is built up which stores the parameter values needed to correct for lens heating, and which in this embodiment consists of two time constants ($\tau_1$ and $\tau_2$) and two scaling factors ($\mu_1$ and $\mu_2$). A set of these parameters can be stored for each reticle and illumination setting of interest.

The technique has been described above in terms of focus drift purely as an example of one type of aberration. Sets of parameters can also be built up and stored in the database which characterize the change in different aberrations, such as astigmatism and coma, as a function of lens heating (time). The higher-order aberrations may depend more sensitively on the particular reticle structure being exposed, and therefore fine tuning measurements can be made using a particular reticle to obtain values of these parameters for different aberrations prior to exposing a particular batch of wafers using that reticle. Any reticle-specific reticle heating effects will then be included in the model as well.

Having obtained and installed a database of parameters defining the lens heating effect, software is used in a feed-forward technique to predict the necessary correction that needs to be made to overcome the aberration calculated according to the model, such as Equation (1). This is done dynamically, and physical adjustments to compensate for the calculated aberration which needs to be corrected are preferably made immediately before each exposure.

To compensate for variations in heating effects between different reticles and at different illumination settings for which fine-tuned parameters have not necessarily been obtained, occasional measurements can also be made intermittently during a batch to dynamically adjust the model. New optimum time constant and/or scaling factor parameters can be calculated after each new measurement by a fit based on a minimization of the residue R. Also, when performing exposures at settings for which parameter values are not available, interpolation or extrapolation from known parameters can be used to give a best estimate for the parameter values to be used at the new setting.

At a particular time, a calculation for each type of aberration effect will give the predicted additional amount of that aberration effect resulting from lens-heating, over and above any intrinsic aberration effect, i.e. the default value for the lens. The correction to make to the lithographic projection apparatus to further compensate for the lens heating effect depends on each particular type of aberration effect according to table 1, for example.

TABLE 1

| Aberration effect | Adjustment | |
|---|---|---|
| Focus drift | adjusting | substrate table height |
| | | substrate table tilt |
| Field curvature | shifting | one or more moveable lens elements along the optical axis |
| Magnification drift | shifting | one or more moveable lens elements along the optical axis |
| | adjusting | axial position of mask along the optical axis |
| Third-order distortion | adjusting | axial position of mask along the optical axis |
| | shifting | one or more moveable lens elements along the optical axis |
| Spherical aberration | shifting | one or more moveable lens elements along the optical axis |
| Comatic aberration | shifting | the central wavelength of the exposure radiation |
| | adjusting | the degree of decentering with respect to the optical axis of one or more moveable lens elements |
| On-axis astigmatism | performing | saddle-like deformation of one or more lens elements using edge actuators |
| Asymmetric magnification | performing | saddle-like deformation of one or more lens elements using edge actuators |

The correction can be performed automatically by the machine, based on tabulated or calculated values relating the magnitude of the aberration effect to the size of the mechanical adjustment necessary. Saddle-like deformation of one or more lens elements to correct for particular aberrations is described, for example, in PCT publication WO 99/67683, incorporated herein by reference.

It may, of course, only be necessary to correct for one or a few of the above (or other) aberration effects. The contribution of each aberration effect will depend on the pattern being exposed, the illumination setting and so on. Therefore it will not always be necessary to make adjustments for all of these aberration effects for every exposure or batch of exposures.

Second Embodiment

In a second embodiment an accurate estimate of all the model parameters is obtained with a single (fine) calibration step. An advantage of this embodiment is the reduction of cycle time in a calibration sequence with respect to the cycle time required for a calibration sequence comprising a coarse and a fine calibration. Characteristic of the embodiment is the method of fitting the model data to the measured fine tune data. The fit-method yields accurate estimates for the time constants as well as the scaling factors. For a given set of time constants $\tau_1$ and $\tau_2$, an estimate for $\mu_1$ and $\mu_2$ and the corresponding residue R can be found in the same way as in the fine calibration step of the first embodiment. Here, the residue R depends on the particular values used for the set of time constants.

To find a first improved estimate for the time constants, residues $R_{ij}$ are calculated for a series of time constants $\tau_{1i}$, i=1, ..., n, and $\tau_{2j}$, j=1, ..., n. Said series of time constants can be considered as defining an n×n matrix of sets ($\tau_{1i},\tau_{2j}$), with i=1, ..., n, and j=1, ..., n. The first set of time ranges defined by the differences $\tau_{1n}-\tau_{1l}$ and $\tau_{2n}-\tau_{2l}$, denoted by TR11 and TR12, respectively, are chosen such that the actual values of $\tau_1$ and $\tau_2$ lie within these ranges (the choice may be based, for example, on previous empirical evidence or a previous coarse calibration). In a typical embodiment, n=21, and the first set of time ranges are given by TR11=TR12= 4000 s. Hence, with 21 sample values for $\tau_1$ and $\tau_2$ the time resolution is 4000/20=200 seconds.

For each set of the matrix ($\tau_{1i},\tau_{2j}$), with i=1, ..., n, and j=1, ..., n, the scaling factors can be found using the method described in the first embodiment. Per set of time constants ($\tau_{1i},\tau_{2j}$) there is one set of scaling factors ($\mu_{1i},\mu_{2j}$) and a corresponding residue $R_{ij}$. The residues $R_{ij}$ are stored in a corresponding matrix addressable memory. The smallest residue in this matrix now represents the best fit, and the corresponding estimates for $\tau_1$ and $\tau_2$ are denoted here by $\tau_{1est1}$ and $\tau_{2est1}$.

To further increase the accuracy for the estimates of $\tau_1$ and $\tau_2$ and $\mu_1$ and $\mu_2$, a new matrix of sets ($\tau_{1i},\tau_{2j}$) with i=1, ..., n, and j=1, ..., n, can be formed, where $\tau_{1n}$, $\tau_{1l}$, $\tau_{2n}$ and $\tau_{2l}$, defining the second set of time ranges TR21 and TR22 (again defined by the differences $\tau_{1n}-\tau_{1l}$ and $\tau_{2n}-\tau_{2l}$, respectively), are chosen such that the values of $\tau_{1est1}$ and $\tau_{2est1}$ are substantially in the center of these time ranges and, for instance, such that TR21=TR22=4 TR12/(n-1). So, in this particular example, the time ranges TR21 and TR22 are 800 seconds. The steps described above can be repeated to yield a second improved estimate for the time constants denoted by $\tau_{1est2}$ and $\tau_{2est2}$. This second estimate is based on a sampling of the time ranges with a resolution of 800/20=40 seconds, so that the accuracy of the estimate is considerably improved over the first estimate. Typically, two more successive steps of increasing accuracy are performed, resulting in a fourth estimate $\tau_{1est4}$ and $\tau_{2est4}$ for respectively $\tau_1$ and $\tau_2$, based on a time resolution of 1.6 seconds.

With a fine calibration as described here the presence of time constants of the order of seconds can be detected. Also, such an estimation of the time constants also leads to a more accurate estimation of the scaling factors.

Figure 3:
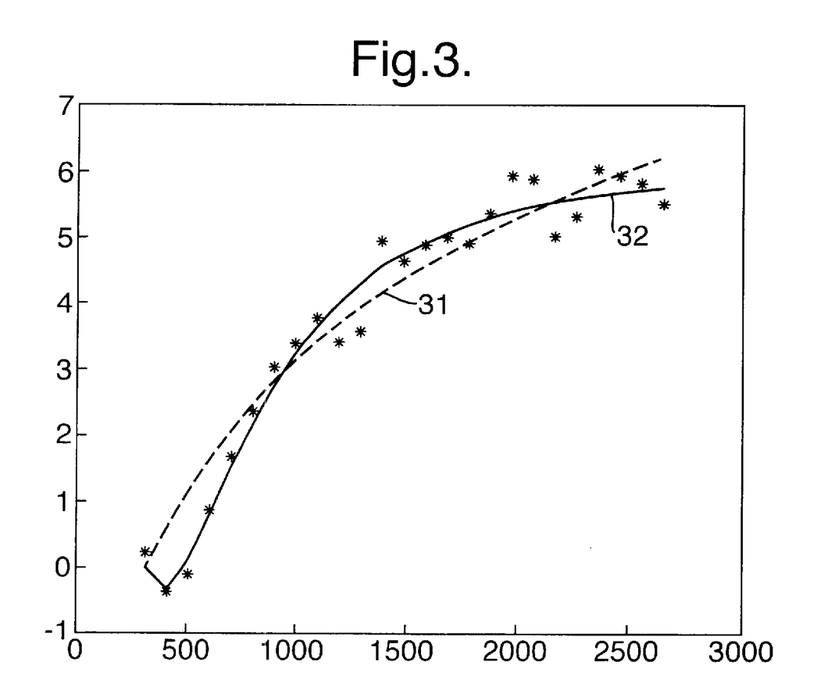
FIG. 3 illustrates two heating trajectories representing two different predictions of magnification drift of a lithographic projection apparatus. Also, a measured magnification drift is shown.

In FIG. 3 a typical example of the aberration effect "magnification drift" is shown. The stars indicate measured magnification drift as a function of time, due to lens heating. The graph 31 is a plot of predicted magnification drift, based on a coarse and fine calibration method as described in the first embodiment. Graph 32 is a plot of magnification drift as predicted by parameters obtained by the method according to the present embodiment. The residue for the prediction 32 is approximately three times smaller than the residue for the prediction 31.

Third Embodiment

As explained previously, the lens heating effect will generally be different for each illumination setting such as numerical aperture, sigma-setting, and whether the illumination mode intensity distribution is disc-like, annular or multi-polar, for example. This is because the amount of light and the shape of the light beam going through the lens differs for each setting. This causes the lens elements to be heated differently and therefore influences the contribution of lens heating to each type of aberration. A quantity that expresses the combination of the numerical aperture NA and the coherence factor sigma is known as NAill, and is defined as:

$$NAill = \frac{NA(\sigma_{inner} + \sigma_{outer})}{2} \qquad (5)$$

where, for annular illumination, $\sigma_{inner}$ and $\sigma_{outer}$ define the inner and outer radii of the annulus, and for conventional, that is disc-like illumination modes, $\sigma_{outer}$ is the sole coherence factor (sigma) and $\sigma_{inner}=0$. An equivalent value for NAill can be obtained for multipolar modes, such as quadrupolar. It has been found empirically that both the scaling factors $\mu_1$ and $\mu_2$ of the model of Equations (1) and (2) depend linearly on the value of NAill, ranging from maximum at the lowest NAill to a value approximately three to five times smaller at the highest NAill. The absolute values depend on the lens type and also show small differences between lenses of the same type. The scaling factors can be measured for a particular lens or machine at, for example, three different NAill settings, preferably at two extreme settings and one intermediate setting. The slope of the dependency of the scaling factors on NAill value can then be obtained by a linear fit, and then, when operating the machine at a NAill setting for which it has not been calibrated, the scaling factors can be linearly interpolated based on this slope from the known scaling factors at the measured NAill settings. This linear NAill-dependency is an empirical approximation. Depending on the accuracy required, more calibrations at intermediate settings or even non-linear NAill-dependencies can be used.

Fourth Embodiment

During exposures, the wafer reflects some of the light back into the lens. This will have a certain effect on lens heating, and thus aberration effects during exposure of a batch, depending on the intensity of the reflected light.

The intensity of the radiation reflected from the wafer depends on a number of factors:

The optical parameters of the photoresist.

The reflectivity of a photoresist type depends on its refractive index. Due to the nature of a photoresist its properties change during exposure, including its refractive index. The transmissivity of a photoresist changes during exposure (bleaching) so the reflectivity also changes. It has been found empirically that for energy doses that cause lens heating to become an issue, the change of refractive index occurs quickly (exponentially) at the beginning of an exposure. This causes reflectivity to remain practically constant during the remaining time of the exposures. Thus, in practice, only the reflectivity of "bleached" photoresist-coated wafers is important.

The photoresist thickness.

It is known that the amount of reflected light from the wafer varies sinusoidally as a function of the photoresist thickness. This effect is caused by the interference of the light reflected by the substrate with the light reflected from the top of the photoresist layer. Normally the reflectivity variation due to photoresist thickness variation will be between 0.05 and 0.45.

The type and composition of the substrate (including stacks).

Apart from the "bare wafer" substrate having a certain reflectivity, which influences the overall reflectivity, a substrate with various layers may also have a similar effect on wafer reflectivity. This is affected by the structure and composition of the stack. Each layer in a stack will reflect light by a certain amount, causing the light to "bounce" back and forth between and through the layers. This causes constructive or destructive interference in the light reflected back to the lens. These effects are further influenced by the presence of anti-reflective coatings.

The illumination setting, NA/sigma setting.

The NA setting determines the maximum angle of incidence of the radiation impinging on the wafer. As the maximum angle increases, more angles of incidence will be present, thereby varying the optical path lengths of the reflected light even more. This in turn, causes less interference (constructive and destructive). The result of this is that when a higher NA setting is used the amplitude of the sinusoidal variation in reflectivity as a function of photoresist thickness becomes smaller. An annular illumination setting will have a similar effect, increasing the amplitude of the reflectivity variation when a stronger annular illumination setting is used ("stronger" implying a thinner ring and thus a smaller range of angles of incidence).

From the above, it is clear that it is very difficult to predict the wafer reflectivity. Thus it is preferable to measure the reflectivity for each batch of wafers. However, it has been found empirically that the scaling factors (and hence an aberration effect such as, for instance, focus drift) are substantially linearly dependent on the wafer reflectivity. It has also been found that the NA/ll setting hardly affects the sensitivity of focus drift to wafer reflectivity.

According to the present embodiment it is possible to adjust for the effect of a wafer reflectivity different from that present during the calibration process. The fine tuning test is repeated using a substrate of the new wafer material with no patterns or structures, but with the photoresist type and thickness as used for the standard fine tuning calibration measurements. A correction factor Cf can be calculated by dividing the total focus drift (or total drift in any desired aberration effect) at saturation with the new substrate by the calibration measurement focus drift (or other desired aberration drift). The calibration focus drift was measured using a bare silicon wafer with photoresist. Substituting from Equations 1 and 2, and rearranging and substituting t=infinity (i.e. at saturation) gives the following equation for the correction factor:

$$Cf = \frac{(\mu_1 + \mu_2)|_{new\ substrate}}{(\mu_1 + \mu_2)|_{calibration}} \qquad (6)$$

Thus the correction factor is essentially given by dividing the sum of the scaling factors with the new substrate by the sum of the calibration scaling factors. According to this embodiment, when this correction factor is applied to the task of exposing the new batch of wafers, the software multiplies each calibration scaling factor $\mu_1$ and $\mu_2$ by the correction factor Cf.

Fifth Embodiment

Batch processing of a plurality of wafers is common practice in a lithographic manufacturing process. At the start of processing a batch of wafers, the projection system may be in a condition where heat-induced aberration effects are substantially absent. In such a situation a change of aberration effect is typically largest during successive exposures of target portions of the first wafer of said batch. So adjustments as determined and applied according to the previous embodiments also typically are largest during the irradiation of target portions of the first wafer. In spite of all precautions, relatively large adjustments may not be as accurate as smaller adjustments. Consequently, resulting residual aberration effects tend to be most pronounced in the patterned layer on said first wafer. This is called the "first-wafer-effect". In this embodiment, the first-wafer-effect is alleviated by supplying the projection beam to the projection system during a period of time $T_{preheat}$ just preceding the start of exposures of target portions of the first wafer. By, for instance, choosing the period of time $T_{preheat}$ to be of the order of magnitude of the largest of the two time constants $\tau_1$ and $\tau_2$, said adjustments during irradiation of the first wafer are substantially reduced, with an attendant reduction of the first-wafer-effect.

A pre-heating of the projection lens as discussed here is of particular relevance for a manufacturing process run on a multiple-stage lithographic projection apparatus. Here, the pre-heating of the lens can be performed while the first wafer is subjected to preparatory steps. During these steps there is no wafer at the exposure position, and therefore, the pre-heating has no impact on the processing time of the batch (i.e. it has no impact on throughput).

While specific embodiments of the invention have been described above, it will be appreciated that the invention may be practiced otherwise than as described. The description is not intended to limit the invention. In particular it will be appreciated that the invention may be used for the projection system of a lithographic apparatus and in any other type of imaging system in which lens aberrations as a result of lens heating are to be compensated. Although the embodiments described above are in terms of correction of lens aberrations which occur or worsen as a result of lens heating effects, the invention is also applicable to other corrections, such as those resulting from radiative compaction of lens elements, quantum and/or atomic effects in the lens, creep, general ageing of the lens and so on; the appended claims also encompass these effects. The invention is also not limited to lens-dependent effects, but is applicable to changes in other components, such as reticle effects, whether caused by heating or otherwise.

What is claimed is:

1. A method of operating a lithographic projection apparatus comprising:

storing a plurality of sets of predetermined parameters corresponding to a plurality of aberration effects;

calculating a change in a selected aberration effect selected from the plurality of aberration effects in a projection system of the lithographic projection apparatus as a function of time, based on a stored selected set of predetermined parameters corresponding to the selected aberration effect, and adjusting the lithographic projection apparatus to compensate for the calculated change in the selected aberration effect.

2. A method according to claim 1, further comprising calibration to obtain said parameters.

3. A method according to claim 2, wherein said calibration comprises at least one calibration selected from the group comprising:

a calibration successively performed at a plurality of different illumination settings of said radiation system, a calibration successively performed with a plurality of different patterns as provided by patterning structure, and a calibration successively performed with a plurality of different substrates provided on a substrate table of said lithographic projection apparatus, wherein a set of parameters is obtained for each calibration, and the sets of parameters from the calibrations are stored in a database.

4. A method according to claim 1, wherein said selected aberration effect comprises a combination of different types of aberration effect, each type having a respective set of predetermined parameters.

5. A method according to claim 3, wherein some of said parameters are common between sets.

6. A method according to claim 4, wherein some of said parameters are common between sets.

7. A method according to claim 1, wherein said parameters comprise at least one time constant and at least one scaling factor.

8. A method according to claim 7, wherein said at least one time constant is common between parameter sets.

9. A method according to claim 1, wherein said calculating comprises calculating the selected aberration effect using at least one function which varies exponentially with time.

10. A method according to claim 9, wherein said calculating comprises using a pair of exponential functions.

11. A method according to claim 1, for operating said projection apparatus under conditions for which a set of parameters has not been predetermined, wherein said calculating comprises at least one of interpolating and extrapolating at least one of said parameters based on parameters obtained for the projection apparatus under different conditions.

12. A method according to claim 11, wherein said conditions are chosen from the group comprising illumination settings and substrate reflectivities.

13. A method according to claim 1, wherein said selected aberration effect comprises at least one of focus drift, field curvature, magnification drift, third-order distortion, spherical aberration, comatic aberration, on-axis astigmatism, asymmetric magnification and combinations thereof.

14. A method according to claim 1, wherein said adjusting comprises adjusting at least one of: the position of a support structure supporting patterning structure of the lithographic projection apparatus along an optical axis of a projection system of the lithographic projection apparatus, a rotational orientation of the support structure, a position of a substrate table of the lithographic projection apparatus along said optical axis, a rotational orientation of the substrate table, a position along the optical axis of one or more moveable lens elements comprised in a projection system of the lithographic projection apparatus, a degree of decentering with respect to said optical axis of one or more moveable lens elements comprised in the projection system, a central wavelength of a projection beam formed by said lithographic projection apparatus, and saddle-like deformation of one or more lens elements comprised in said projection system using edge actuators.

15. A method according to claim 1, further comprising repeatedly performing said calculating and adjusting during a series of repeated exposures of a corresponding series of target portions, to provide dynamic aberration correction.

16. A method according to claim 15, wherein calculating and adjusting is performed at least once between each exposure of a target portion of the substrate.

17. A method according to claim 14, further comprising calibration intermittently during said series of repeated exposures.

18. A lithographic projection apparatus comprising:
   a radiation system to provide a projection beam of radiation, the radiation system being adjustable to permit a plurality of different illumination settings;
   patterning structure constructed and arranged to produce a desired pattern in a cross section of the projection beam;
   a support structure to support the patterning structure;
   a substrate table to hold a substrate;
   a projection system to project the patterned beam onto a target portion of the substrate;
   a memory to store a plurality of sets of predetermined parameters corresponding to a plurality of aberration effects;
   a processor to calculate a change in a selected aberration effect selected from the plurality of aberration effects in said projection system, due to heating effects, as a function of time, based on a selected set of said parameters corresponding to the selected aberration effect stored in said memory; and
   a controller to adjust at least one component of said apparatus to compensate for the calculated change in the selected aberration effect.

19. An apparatus according to claim 18, wherein the support structure comprises a mask table.

20. An apparatus according to claim 18, wherein the radiation system comprises a radiation source.

21. A device manufacturing method using a lithographic projection apparatus comprising:
   projecting a patterned beam of radiation onto a target portion of a layer of radiation-sensitive material on a substrate;
   storing a plurality of sets of predetermined parameters corresponding to a plurality of aberration effects;
   repeatedly calculating, during series of repeated exposures of corresponding series of target portions, a change in a selected aberration effect selected from the plurality of aberration effects in a projection system of the lithographic projection apparatus as a function of time, based on a stored selected set of predetermined parameters corresponding to the selected aberration effect, and
   adjusting the lithographic projection apparatus to compensate for the calculated change in the selected aberration effect.

22. A device manufactured according to the method of claim 21.

* * * * *

UNITED STATES PATENT AND TRADEMARK OFFICE
CERTIFICATE OF CORRECTION

PATENT NO. : 6,563,564 B2
DATED : May 13, 2003
INVENTOR(S) : De Mol et al.

Page 1 of 1

It is certified that error appears in the above-identified patent and that said Letters Patent is hereby corrected as shown below:

<u>Title page,</u>
Item [73], Assignee: please change "ASM Lithography B.V." to -- ASML Netherlands B.V. --

Signed and Sealed this

Thirtieth Day of September, 2003

JAMES E. ROGAN
*Director of the United States Patent and Trademark Office*